United States Patent
Li et al.

(10) Patent No.: US 10,574,264 B2
(45) Date of Patent: Feb. 25, 2020

(54) METHOD AND APPARATUS FOR SUPPORTING LOW BIT RATE CODING, AND COMPUTER STORAGE MEDIUM

(71) Applicant: ZTE Corporation, Shenzhen, Guangdong (CN)

(72) Inventors: Liguang Li, Shenzhen (CN); Jun Xu, Shenzhen (CN); Zhifeng Yuan, Shenzhen (CN); Jin Xu, Shenzhen (CN); Kaibo Tian, Shenzhen (CN); Jun Zhang, Shenzhen (CN); Haiming Wang, Shenzhen (CN); Shiwen He, Shenzhen (CN)

(73) Assignee: ZTE Corporation, Shenzhen, Guangdon (CN)

( * ) Notice: Subject to any disclaimer, the term of this patent is extended or adjusted under 35 U.S.C. 154(b) by 379 days.

(21) Appl. No.: 15/124,785

(22) PCT Filed: Aug. 26, 2014

(86) PCT No.: PCT/CN2014/085228
§ 371 (c)(1),
(2) Date: Sep. 9, 2016

(87) PCT Pub. No.: WO2015/135298
PCT Pub. Date: Sep. 17, 2015

(65) Prior Publication Data
US 2017/0222660 A1    Aug. 3, 2017

(30) Foreign Application Priority Data
Mar. 11, 2014 (CN) .......................... 2014 1 0087934

(51) Int. Cl.
*H03M 13/00* (2006.01)
*H03M 13/11* (2006.01)

(52) U.S. Cl.
CPC ...... *H03M 13/1177* (2013.01); *H03M 13/116* (2013.01); *H03M 13/118* (2013.01);
(Continued)

(58) Field of Classification Search
CPC ...... H03M 13/00; H03M 13/05; H03M 13/11; H03M 13/1137; H03M 13/114;
(Continued)

(56) References Cited

U.S. PATENT DOCUMENTS 6,868,156 B1 * 3/2005 Narayan .................. H04Q 1/30
379/379
2005/0110286 A1   5/2005 Zhang
(Continued)

FOREIGN PATENT DOCUMENTS

CN       1622649 A       6/2005
CN     101047387 A      10/2007
(Continued)

OTHER PUBLICATIONS

English Translation of the Written Opinion of the International Search Authority in international application No. PCT/CN2014/085228, dated Dec. 1, 2014, 11 pgs.*

(Continued)

*Primary Examiner* — Albert Decady
*Assistant Examiner* — Enamul M Kabir
(74) *Attorney, Agent, or Firm* — Cooper Legal Group, LLC

(57) ABSTRACT

The disclosure discloses a method for supporting low bit rate coding. A source data packet to be coded is repeated for i times, and the data packet which is repeated for i times is coded. The disclosure also discloses an apparatus for supporting low bit rate coding and a computer storage medium.

16 Claims, 1 Drawing Sheet

(52) U.S. Cl.
CPC ..... *H03M 13/616* (2013.01); *H03M 13/6356* (2013.01); *H03M 13/114* (2013.01); *H03M 13/1137* (2013.01)

(58) Field of Classification Search
CPC ........... H03M 13/116; H03M 13/1177; H03M 13/118; H03M 13/616; H03M 13/6356; H04L 1/00; H04L 29/06
See application file for complete search history.

(56) References Cited

U.S. PATENT DOCUMENTS

| | | | |
|---|---|---|---|
| 2005/0246616 A1* | 11/2005 | Choi | H03M 13/116 714/801 |
| 2008/0204286 A1 | 8/2008 | Kose | |
| 2009/0106620 A1* | 4/2009 | Yokokawa | H03M 13/1111 714/752 |
| 2011/0085609 A1 | 4/2011 | Kasher | |
| 2011/0289375 A1* | 11/2011 | Jiang | H03M 13/033 714/752 |
| 2011/0307755 A1* | 12/2011 | Livshitz | H03M 13/1111 714/752 |
| 2013/0073927 A1 | 3/2013 | Kasher | |
| 2013/0311850 A1* | 11/2013 | Shinohara | H03M 13/036 714/758 |

FOREIGN PATENT DOCUMENTS

| | | | |
|---|---|---|---|
| CN | 101136638 A | | 3/2008 |
| CN | 101442315 A | * | 5/2009 |
| CN | 101442315 A | | 5/2009 |
| CN | 101453220 A | | 6/2009 |
| CN | 101488760 A | | 7/2009 |
| CN | 101499804 A | | 8/2009 |
| CN | 101635573 A | | 1/2010 |
| CN | 101924565 A | | 12/2010 |
| CN | 102611465 A | | 7/2012 |
| CN | 103152058 A | | 6/2013 |
| EP | 1837999 A1 | | 9/2007 |
| KR | 20070046477 A | | 5/2007 |
| WO | 2011043871 A2 | | 4/2011 |

OTHER PUBLICATIONS

International Search Report in international application No. PCT/CN2014/085228, dated Dec. 1, 2014, 6 pgs.
English Translation of the Written Opinion of the International Search Authority in international application No. PCT/CN2014/085228, dated Dec. 1, 2014, 15 pgs.
Supplementary European Search Report in European application No. 14885292.4, dated Feb. 17, 2017, 12 pgs.
"Performance Evaluation of Low Density Parity Check Codes for IEEE 802.11n and Its ASIC Design", W.A.Syafei, Y. Nagao, R. Yohena, H. Shimajiri, T. Yoshida, M. Kurosaki, B.Saj and H. Ochi, Oct. 2008, Proc. , IEEE International Symposium on Communications and Information Technologies, ISCIT 2008, pp. 609-614.
"Construction of multiple-rate QC-LDPC codes with constant block lengths" Wang Qi, Xie Qiuliang and Wang, Zhaocheng, 2013, China Academic Journal, J. Tsinghus University (Sci & Tech), vol. 53, No. 3, Abstract in English, 5 pgs.
"Design and implementation of a high throughput decoder for multi-rate LDPC code", Guanwu, Qiao Hua, Dong Ming-Ke and Ziang Hai-Ge, Apr. 2009, Journal of Circuits and Systems, vol. 14, No. 2, 6 pgs. Abstract in English.
"Optimized extension of the parity-check matrix for rate-compatible LDPC codes" Chenzi-Qiang, Ouyang Shan, Li Min-Zheng, Zang Lan and Xiao Hai-Lin, Sep. 2013, Systems Engineering and Electronics, vol. 35, No. 9, 5 pgs. Abstract in English.
"Rate-Compatible QC-LDPC Codes Design Based on EXIT Chart Analysis", Zaishuang Liu, Kewu Peng, Weilong Lei, Chen Qian and Zhaocheng Wang, Aug. 2012, Published in: 2012 8th International Wireless Communications and Mobile Computing Conference (IWCMC), pp. 921-926.
"VLSI Decoder Architecture for High Throughput, Variable Block-size and Multi-rate LDPC Codes", Yang Sun, Marjan Karkooti and Joseph R. Cavellaro, May 2007, reprinted from the Internet at: http://www.ece.rice.edu/~ys4937/distribute/YangSun_LDPC_ISCAS-07.pdf, pp. 2104-2107.

* cited by examiner

METHOD AND APPARATUS FOR SUPPORTING LOW BIT RATE CODING, AND COMPUTER STORAGE MEDIUM

TECHNICAL FIELD

The disclosure relates to a coding technology of digital communication, and in particular to a method and apparatus for supporting low bit rate coding, and a computer storage medium.

BACKGROUND

As wireless digital communication develops and various services with high rate and strong abruptness emerge, people make much higher demands for an error correction coding technology. Low Density Parity Check (LDPC) Codes are a class of linear packet codes which can be defined by a very sparse parity check matrix or a bipartite graph. The LDPC codes were discovered by Gallager initially, so they are called Gallager codes. After decades of silence, as computer hardware and relevant theories develop, MacKay and Neal re-discover the Gallager codes and prove that the Gallager codes have properties approaching a Shannon limit. The latest research shows that the LDPC codes are characterized by being low in decoding complexity, capable of linear time coding and parallel decoding, and superior to Turbo codes under the condition of large code length, and having properties approaching the Shannon limit.

The LDPC codes are linear packet codes based on sparse parity check matrices, and low-complexity coding and decoding can be achieved using the sparseness of the parity check matrices, such that the LDPC codes tend to be practical. Irregular codes refer to LDPC codes of which parity check matrices have totally different row weights and column weights, and column weights of information bit parts of the parity check matrices are also different. Regular codes refer to LDPC codes of which parity check matrices have identical row weights and column weights. In related articles, someone calls the LDPC codes, under a second situation, in the regular codes as semi-regular codes. The frequency distribution of a basic parity check matrix is consistent with that of a parity check matrix.

The LDPC codes are special liner packet codes. In communication, every time a code word of which the packet length is N bits, M check bits are needed in order to ensure that the code word has a certain error correcting capability, and each code word is required to meet $Hx^T=0^T$, where H is an M×N-dimension parity check matrix on a binary field, and $x^T$ is a 1×N sequence. All operations are carried out on a binary field GF(2). Here, addition and subtraction operations are exclusive-OR operations, and a multiplication operation is an AND operation.

The parity check matrix H of a structured LDPC code is set as an (M×z)×(N×z) matrix which is composed of M×N block matrices. Each block matrix is different powers of a z×z basic permutation matrix, and when the basic permutation matrix is a unit matrix, each block matrix is a cyclic shift matrix (right shift herein in default) of the unit matrix. Each block matrix can be uniquely identified by a power j, the power of the unit matrix can be represented by 0, and the matrix is represented by −1 generally. Thus, if each block matrix of H is replaced with a power thereof, an M×N power matrix Hb is obtained. Here, Hb is defined as a basic parity check matrix of H, H being called as a parity check matrix of Hb. During practical coding, z is equal to a value obtained by dividing a code length by a column number N of a basic parity check matrix, which is called as an expansion factor.

For instance, a matrix $$H = \begin{bmatrix} 1 & 0 & 0 & 0 & 1 & 0 & 1 & 0 & 0 & 0 & 0 & 0 \\ 0 & 1 & 0 & 0 & 0 & 1 & 0 & 1 & 0 & 0 & 0 & 0 \\ 0 & 0 & 1 & 1 & 0 & 0 & 0 & 0 & 1 & 0 & 0 & 0 \\ \hline 0 & 0 & 1 & 0 & 1 & 0 & 0 & 0 & 1 & 0 & 1 & 0 \\ 1 & 0 & 0 & 0 & 0 & 1 & 1 & 0 & 0 & 0 & 0 & 1 \\ 0 & 1 & 0 & 1 & 0 & 0 & 0 & 1 & 0 & 1 & 0 & 0 \end{bmatrix}$$

can be obtained by expansion using a parameter z and a 2×4 basic parity check matrix Hb, wherein z=3, and $$Hb = \begin{bmatrix} 0 & 1 & 0 & -1 \\ 2 & 1 & 2 & 1 \end{bmatrix}.$$

Thus, that is to say, a coder for an LDPC code is generated by a basic parity check matrix Hb, an expansion factor z and a selected basic permutation matrix. According to a definition of the above basic parity check matrix, it can be seen that the basic parity check matrix and the parity check matrix are consistent essentially under the condition that an expansion factor (an integer z greater than 1) is given.

A direct LDPC coding method refers to: dividing a code word x into N−M information bits s and M check bits c, and accordingly, dividing an M×N parity check matrix H into an M×(N−M) block corresponding to the information bits and an M×M block corresponding to the check bits respectively, that is, H=[A|B], A and B being blocks. According to H×x=0, the following formula can be obtained:

$$[A \mid B] \times \begin{bmatrix} s \\ c \end{bmatrix} = 0$$

So, A×s+B×c=0 can be obtained, and $c=B^{-1}As$ is further derived. When the block B adopts a special matrix structure such as a strictly lower triangular matrix (semi-random matrix) and a doubly lower triangular structure, $B^{-1}$ has a very simple form, a check bit part c in the code word can be directly calculated in accordance with the above formula, and it can be ensured that the coder has linear complexity.

LDPC coding can also adopt a Richarson linear time coding algorithm: a parity check matrix H has a quasi-lower triangular structure, and given that H has the following form:

$$H = \begin{pmatrix} A & B & T \\ C & D & E \end{pmatrix}$$

Given that a coded code word is $x=(s,p_1,p_2)$. Here, s is a system bit part of the coded code word, $p_1$ and $p_2$ are check bit parts of the code word, the length of $p_1$ is g, and the length of $p_2$ is (m−g). In the above formula, the dimensionality of A is (m−g)×(n−m), the dimensionality of B is (m−g)×g, the dimensionality of T is (m−g)×(m−g), the dimensionality of C is g×(n−m), the dimensionality of D is g×g, and the dimensionality of E is g×(m−g). All these matrices are sparse matrices, T is a lower triangular matrix, and all main diagonal elements are 1. The check bit part can be obtained by the following formulae:

$$p_1^T = -\varphi^{-1}(-ET^{-1}A+C)s^T$$

$$p_2^T = -T^{-1}(As^T+Bp_1^T), \text{ where } \varphi = -ET^{-1}B+D.$$

It is crucial to search for an appropriate LDPC code parity check matrix structure. During specific implementation, a direct method or a Richarson method or other methods can be adopted for operation so as to complete coding of N bit code words from N−M bit source data. Actually, the coder achieves multiplication and addition operations for a sparse matrix in the formula using software or hardware. The multiplication operation for the sparse matrix can be composed of a plurality of z-bit (z being an expansion factor) cyclic shift registers and a plurality of z-bit adders, for LDPC codes based on unit matrices and cyclic shift matrices thereof. The addition operation for the sparse matrix is completed by the plurality of z-bit adders. The plurality of z-bit cyclic shift registers and the plurality of z-bit adders construct an LDPC coder implemented by a hardware circuit.

There are multiple LDPC decoding methods such as a probability domain BP decoding algorithm, a log domain BP decoding algorithm and a layered min-sum decoding algorithm. The probability domain BP decoding algorithm has the best performance. However, the disadvantages of the probability domain BP decoding algorithm lie in that the needed hardware cost is very high and a dynamic range of a numerical value is large and low in stability due to the fact that a great number of multiplication operations are involved and the operation quantity is large, so the probability domain BP decoding algorithm cannot be used usually in practical application. Compared with the probability domain BP decoding algorithm, the log domain BP decoding algorithm reduces lots of calculation units, but many multiplication operations are also needed, so the needed hardware cost is also high. The layered min-sum decoding algorithm transforms key calculation (log operation and multiplication operation) units of the log domain BP decoding algorithm into calculation of a minimum value and a secondary minimum value, needed hardware resources are greatly reduced, the performance will be slightly lost, and many hardware resources can be reduced. Consequently, the layered min-sum decoding algorithm is more frequently adopted in practical application.

A structured LDPC code decoder has inherent decoding parallelism, so the decoding speed is high, the throughput is high, and the decoding performance quite approaches the Shannon limit.

In various current communication modes, control signalling data will be coded with a lower bit rate so as to improve transmission reliability, or important data parts will adopt a lower bit rate coding mode to guarantee data correctness. However, various current communication systems obtain a lower bit rate implementation mode in a simple rate matching mode via higher bit rate LDPC codes. Thus, it is difficult to fully utilize coding gains, which causes poor performance of the coding and decoding system. So, an LDPC code coding method supporting a low bit rate is urgently needed now.

SUMMARY

In order to solve the existing technical problems, the disclosure expects to provide a method and apparatus for supporting low bit rate coding, and a computer storage medium.

The technical solutions of the embodiments of the disclosure are implemented as follows.

An apparatus for supporting low bitrate coding, provided by an embodiment of the disclosure, at least includes: a repeater and a coder, wherein the repeater is configured to repeat a source data packet to be coded for i times, i being a positive integer; and the coder is configured to code the data packet repeated by the repeater, coding being LDPC coding, Turbo coding or convolutional coding.

A method for supporting low code bit coding, provided by an embodiment of the disclosure, at least includes that:

a source data packet to be coded is repeated for i times, and the data packet which is repeated for i times is coded, wherein i is a positive integer, and coding is LDPC coding, Turbo coding or convolutional coding.

An embodiment of the disclosure also provides a computer storage medium. A computer program is stored therein and is configured to execute the above method for supporting low bit rate coding.

The embodiments of the disclosure provide a method and apparatus for supporting low bit rate coding, and a computer storage medium. A source data packet to be coded is repeated for i times, and the data packet which is repeated for i times is coded. Thus, low bit rate coding can be achieved. By repeating the source data packet to be coded for several times and then coding the data packet, coding gains can be fully utilized, and the coding and decoding performances of a coding and decoding system under a lower bit rate are improved.

DETAILED DESCRIPTION

The basic idea of the disclosure is that: a source data packet to be coded is repeated for i times, and the data packet which is repeated for i times is coded. Thus, low bit rate coding can be achieved, and coding gains can be fully utilized.

The disclosure is further illustrated below with reference to the drawings and specific embodiments in detail.

First Embodiment

Figure 1:
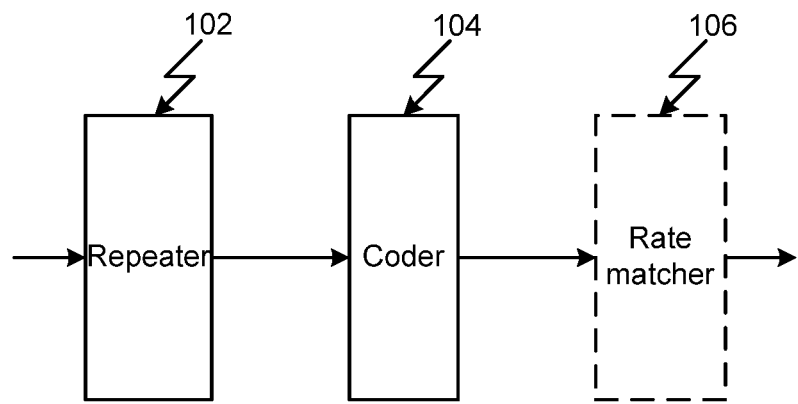
FIG. 1 is a structural diagram of an apparatus for supporting low bit rate coding provided by a first embodiment of the disclosure.

The embodiment of the disclosure implements an apparatus for supporting low bit rate coding. As shown in FIG. 1, the apparatus at least includes: a repeater 102 and a coder 104, wherein the repeater 102 is configured to repeat a k-bit source data packet x to be coded for i times, i being a positive integer; and the coder 104 is configured to code the data packet repeated by the repeater 102, coding being LDPC coding, Turbo coding or convolutional coding.

The repeater 102 is specifically configured to directly repeat the source data packet x to be coded for i times, or the source data packet x includes j sub-data packets, the j sub-data packets are repeated for i times respectively, j is a positive integer, and i may be 1, 2, 3, 4, 5 or 6 generally.

Specifically, the coder 104 is an (nb×z, kb×z) LDPC coder, and a master code data packet C' is obtained by coding, where nb is a column number of a basic parity check matrix, z is an expansion factor, z, nb and kb are positive integers, kb=nb−mb, mb is a row number of the basic parity check matrix, and mb is a positive integer. Before the coder 104 carries out coding, the basic parity check matrix is read, and then values of r non −1 element in the basic parity check matrix are set as −1, where r is an integer which is greater than or equal to 0 and is smaller than r0, and r0 is the number of non −1 elements in an original basic parity check matrix.

The apparatus may further include a rate matcher 106, configured to carry out rate matching on the master code data packet C' so as to obtain an N-bit coded data packet, N being a code length.

The working process of the apparatus for supporting low bit rate LDPC code coding according to the present embodiment is illustrated below by means of four specific examples.

First Example

Given that a basic parity check matrix $Hb_{8\times 16}$ is as follows:

A bit rate corresponding to the shown basic parity check matrix $Hb_{8\times 16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. The coder 104 is a (16×42, 8×42) LDPC coder, a source data packet to be coded is a signalling sequence $a=[a_0, a_1, a_2, \ldots, a_{71}]$ (k=72 bits), and when LDPC coding is carried out on the signalling sequence a using a 1/2 bit rate LDPC code basic parity check matrix to obtain a coded data packet e (n=1024 bits), the repeater 102 repeats the signalling sequence a for one time, and then expands to obtain a 336-bit data packet $d=[(d_0, d_1, \ldots, d_{335}]$, d being as follows:

$$d_i = a_{i-180} \ i=180,181,\ldots,209$$

$$d_i = a_{i-222} \ i=222,223,\ldots,293$$

$$d_i = a_{i-264} \ i=294,295,\ldots,335;$$

$$d_i = 0 \ i=\text{others}$$

the coder 104 carries out LDPC coding on the data packet d to obtain a check data packet $b=[b_0, b_1, \ldots, b_{335}]$, and combines the signalling sequence a and the 336-bit check data packet b into a 408-bit master code data packet $s=[a, b]=[s_0, s_1, \ldots, s_{407}]$; and the rate matcher 106 constructs a 1024-bit coded data packet e by the master code data packet s, e being:

$$e_j = s_j \ j=0,1,\ldots,407$$

$$e_j = s_{j-408} \ j=408,409,\ldots,815$$

$$e_j = s_{j-816} \ j=816,817,\ldots,1023.$$

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| | | | | | A | | | | | | | | B | | | |
| 0 | −1 | 0 | −1 | 0 | −1 | 0 | −1 | 0 | 0 | −1 | −1 | −1 | −1 | −1 | −1 | −1 |
| 1 | 0 | −1 | −1 | 34 | −1 | 12 | −1 | 36 | 18 | 23 | −1 | −1 | −1 | −1 | −1 | −1 |
| 2 | 8 | −1 | 0 | −1 | 0 | −1 | 0 | −1 | −1 | 36 | 0 | −1 | −1 | −1 | −1 | −1 |
| 3 | −1 | 16 | 40 | −1 | 32 | −1 | 22 | −1 | −1 | −1 | 19 | 0 | −1 | −1 | −1 | −1 |
| 4 | −1 | 20 | −1 | 22 | −1 | 2 | −1 | 28 | 32 | −1 | −1 | 21 | 0 | −1 | −1 | −1 |
| 5 | 30 | −1 | 18 | −1 | −1 | 14 | −1 | 30 | −1 | 18 | −1 | −1 | 31 | 0 | −1 | −1 |
| 6 | 40 | −1 | 12 | −1 | 38 | −1 | 6 | −1 | −1 | −1 | 26 | −1 | −1 | 13 | 0 | −1 |
| 7 | −1 | 24 | −1 | 20 | 10 | −1 | 2 | −1 | −1 | −1 | −1 | 18 | −1 | −1 | 5 | 0 |

Second Example

Given that a basic parity check matrix $Hb_{8\times16}$ is as follows:

|   | 0  | 1  | 2  | 3  | 4  | 5  | 6  | 7  | 8  | 9  | 10 | 11 | 12 | 13 | 14 | 15 |
|---|----|----|----|----|----|----|----|----|----|----|----|----|----|----|----|----|
|   |    |    |    | A  |    |    |    |    |    |    |    |    | B  |    |    |    |
| 0 | -1 | 0  | -1 | 0  | -1 | 0  | -1 | 0  | 0  | -1 | -1 | -1 | -1 | -1 | -1 | -1 |
| 1 | 0  | -1 | -1 | 34 | -1 | 12 | -1 | 36 | 18 | 23 | -1 | -1 | -1 | -1 | -1 | -1 |
| 2 | 8  | -1 | 0  | -1 | 0  | -1 | 0  | -1 | -1 | 36 | 0  | -1 | -1 | -1 | -1 | -1 |
| 3 | -1 | 16 | 40 | -1 | 32 | -1 | 22 | -1 | -1 | -1 | 19 | 0  | -1 | -1 | -1 | -1 |
| 4 | -1 | 20 | -1 | 22 | -1 | 2  | -1 | 28 | 32 | -1 | -1 | 21 | 0  | -1 | -1 | -1 |
| 5 | 30 | -1 | 18 | -1 | -1 | 14 | -1 | 30 | -1 | 18 | -1 | -1 | 31 | 0  | -1 | -1 |
| 6 | 40 | -1 | 12 | -1 | 38 | -1 | 6  | -1 | -1 | -1 | 26 | -1 | -1 | 13 | 0  | -1 |
| 7 | -1 | 24 | -1 | 20 | 10 | -1 | 2  | -1 | -1 | -1 | -1 | 18 | -1 | -1 | 5  | 0  |

A bit rate corresponding to the shown basic parity check matrix $Hb_{8\times16}$ is 1/2, an expansion factor $z=42$, a matrix row number is 8, a matrix column number is 16, numbers shown in left is row indexes, uppermost numbers are column indexes, a letter 'A' represents a system bit part matrix, and a letter 'B' represents a check bit part matrix. The coder 104 is a (16×42, 8×42) LDPC coder, a source data packet to be coded is a signalling sequence $a=[a_0, a_1, a_2, \ldots, a_{79}]$ (k=80 bits), and when LDPC coding is carried out on the signalling sequence a using a 1/2 bit rate LDPC code basic parity check matrix to obtain a coded data packet e (n=672 bits), the repeater 102 repeats the signalling sequence a for one time, and then expands to obtain a 336-bit data packet $d=[d_0, d_1, \ldots, d_{335}]$, d being as follows:

$d_i = a_{i-172}\ i=172,173,\ldots,209$ $d_i = a_{i-214}\ i=214,215,\ldots,293$ $d_i = a_{i-256}\ i=294,295,\ldots,335;$ $d_i = 0\ i=\text{others}$ the coder 104 carries out LDPC coding on the data packet d to obtain a check data packet $b=[b_0, b_1, \ldots, b_{335}]$, and combines the signalling sequence a and the 336-bit check data packet b into a 416-bit master code data packet $s=[a, b]=[s_0, s_1, \ldots, s_{415}]$; and the rate matcher 106 constructs a 672-bit coded data packet e by the master code data packet s, e being:

$e_j = s_j\ j=0,1,\ldots,415$ $e_j = s_{j-416}\ j=416,417,\ldots,671.$

Third Example

Given that a basic parity check matrix $Hb_{8\times16}$ is as follows:

A bit rate corresponding to the shown basic parity check matrix $Hb_{8\times16}$ is 1/2, an expansion factor $z=42$, a matrix row number is 8, a matrix column number is 16, numbers shown in left is row indexes, uppermost numbers are column indexes, a letter 'A' represents a system bit part matrix, and a letter 'B' represents a check bit part matrix. The coder 104 is a (16×42, 8×42) LDPC coder, the basic parity check matrix is an 8×16 matrix, the expansion factor $z=42$, a source data packet to be coded is a signalling sequence $f=[f_0, f_1, \ldots, f_{39}]$ (k=40 bits), and when LDPC coding is carried out on the signalling sequence f using a 1/2 bit rate LDPC code basic parity check matrix to obtain a coded data packet h (n=672 bits), the repeater 102 repeats the signalling sequence f for one time, and then expands to obtain a 336-bit data packet $d=[d_0, d_1, \ldots, d_{335}]$, d being as follows:

$d_i = f_{i-254}\ i=254,255,\ldots,293$ $d_i = f_{i-296}\ i=296,297,\ldots,335;$ $d_i = 0\ i=\text{others}$ the coder 104 carries out LDPC coding on the data packet d to obtain a check data packet $b=[b_0, b_1, \ldots, b_{335}]$, and combines the signalling sequence a and the 336-bit check data packet b into a 376-bit master code data packet $g=[f, b]=[g_0, g_1, \ldots, g_{375}]$; and the rate matcher 106 constructs a 672-bit coded data packet h by the master code data packet g, h being:

$h_j = g_j\ i=0,1,\ldots,375$ $h_j = g_{j-376}\ i=376,417,\ldots,671$

|   | 0  | 1  | 2  | 3  | 4  | 5  | 6  | 7  | 8  | 9  | 10 | 11 | 12 | 13 | 14 | 15 |
|---|----|----|----|----|----|----|----|----|----|----|----|----|----|----|----|----|
|   |    |    |    | A  |    |    |    |    |    |    |    |    | B  |    |    |    |
| 0 | -1 | 39 | -1 | 13 | -1 | 22 | -1 | 9  | 20 | -1 | -1 | -1 | -1 | -1 | -1 | -1 |
| 1 | 17 | -1 | -1 | 26 | -1 | 2  | -1 | 18 | 40 | 4  | -1 | -1 | -1 | -1 | -1 | -1 |
| 2 | 34 | -1 | 24 | -1 | 28 | -1 | 19 | -1 | -1 | 8  | 29 | -1 | -1 | -1 | -1 | -1 |
| 3 | -1 | 36 | 6  | -1 | 14 | -1 | 38 | -1 | -1 | -1 | 16 | 30 | -1 | -1 | -1 | -1 |
| 4 | -1 | 33 | -1 | 39 | -1 | 24 | -1 | 27 | 18 | -1 | -1 | 18 | 33 | -1 | -1 | -1 |
| 5 | 9  | -1 | 30 | -1 | -1 | 4  | -1 | 36 | -1 | 12 | -1 | -1 | 24 | 0  | -1 | -1 |
| 6 | 26 | -1 | 12 | -1 | 0  | -1 | 15 | -1 | -1 | -1 | 32 | -1 | -1 | -1 | 0  | -1 |
| 7 | -1 | 30 | -1 | 10 | 28 | -1 | 34 | -1 | -1 | -1 | -1 | 11 | -1 | -1 | -1 | 0  |

Fourth Example

Given that a basic parity check matrix $Hb_{8\times16}$ is as follows:

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    | B  |    |    |    |    |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 0 | -1 | -1 | -1 | -1 | -1 | -1 |
| 2 | 8 | -1 | 0 | -1 | 0 | -1 | 0 | -1 | -1 | 13 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 |

A bit rate corresponding to the shown basic parity check matrix $Hb_{8\times16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. The coder 104 is a (16×42, 8×42) LDPC coder, a source data packet to be coded is a signalling sequence $a=[a_0, a_1, a_2, \ldots, a_{79}]$ (k=80 bits), and when LDPC coding is carried out on the signalling sequence a using a 1/2 bit rate LDPC code basic parity check matrix to obtain a coded data packet e (n=672 bits), the repeater 102 repeats the signalling sequence a for one time, and then expands to obtain a 336-bit data packet $d=[d_0, d_1, \ldots, d_{335}]$, d being as follows:

$$d_i = a_{i-172}\ i=172,173,\ldots,209$$

$$d_i = a_{i-214}\ i=214,215,\ldots,293$$

$$d_i = a_{i-256}\ i=294,295,\ldots,335;$$

$$d_i = 0\ i=\text{others}$$

the coder 104 modifies an element '0' in the second row and the sixth column in the basic parity check matrix into '−1' first. The modified basic parity check matrix is as follows:

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    | B  |    |    |    |    |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 0 | -1 | -1 | -1 | -1 | -1 | -1 |
| 2 | 8 | -1 | 0 | -1 | 0 | -1 | -1 | -1 | -1 | 13 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 | the coder 104 carries out LDPC coding on the data packet d to obtain a check data packet $b=[b_0, b_1, \ldots, b_{335}]$, and combines the signalling sequence a and the 336-bit check data packet b into a 416-bit master code data packet $s=[a, b]=[s_0, s_1, \ldots, s_{415}]$; and the rate matcher 106 constructs a 672-bit coded data packet e by the master code data packet s, e being:

$$e_j = s_j\ j=0,1,\ldots,415$$

$$e_j = s_{j-416}\ j=416,417,\ldots,671.$$

Second Embodiment

Figure 2:
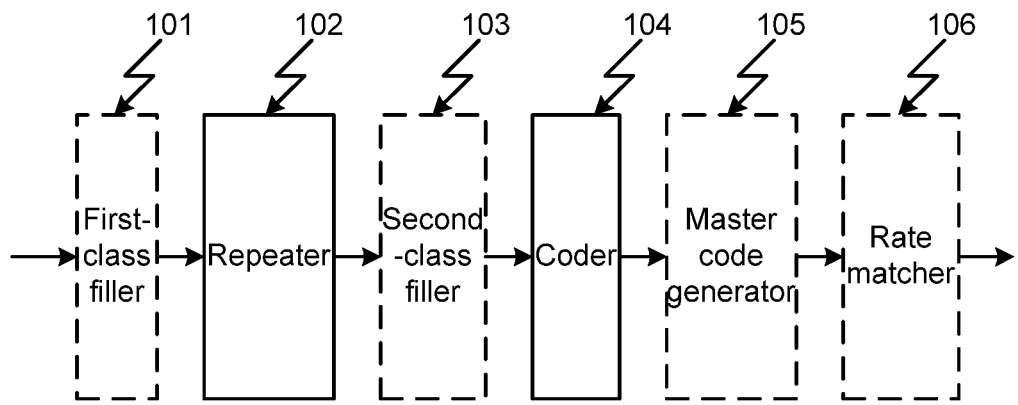
FIG. 2 is a structural diagram of an apparatus for supporting low bit rate coding provided by a second embodiment of the disclosure.

The embodiment of the disclosure implements an apparatus for supporting low bit rate coding. As shown in FIG. 2, the apparatus at least includes: a repeater 102 and a coder 104, wherein the repeater 102 is configured to repeat a k-bit source data packet x to be coded for i times, i being a positive integer; and the coder 104 is configured to code the data packet repeated by the repeater 102, coding being LDPC coding, Turbo coding or convolutional coding.

Specifically, the coder 104 is an (nb×z, kb×z) LDPC coder, and a check data packet P is obtained by coding, where nb is a column number of a basic parity check matrix, (nb−kb) is a row number of the basic parity check matrix, z is an expansion factor, and z, nb and kb are positive integers. Before the coder 104 carries out coding, the basic parity check matrix is read, and then values of r non −1 element in the basic parity check matrix are set as −1, where r is an integer which is greater than or equal to 0 and is smaller than r0, and r0 is the number of non −1 elements in an original basic parity check matrix.

The apparatus may further include a master code generator 105, the master code generator 105 combines the check data packet P, obtained by the coder 104, and the source data packet x into a master code data packet C', and an N-bit coded data packet can be obtained by carrying out rate matching on the master code data packet C' via a rate matcher 106, N being a code length.

The apparatus may further include a first-class filler 101, configured to fill the source data packet x to be coded with q1 elements so as to obtain a first data packet $x_0$ by expansion, q1 being a positive integer.

The repeater 102 directly repeats the first data packet $x_0$ for i times, or the first data packet $x_0$ is split into j sub-data packets, the j sub-data packets are repeated for i times respectively, j is a positive integer, and i may be 1, 2, 3, 4, 5 or 6 generally.

The apparatus can fill the data packet repeated by the repeater 102 with q2 elements via a second-class filler 103 so as to obtain a second data packet Y, q2 being a positive integer.

The apparatus may further include the rate matcher 106, configured to carry out rate matching on the master code data packet C so as to obtain the N-bit coded data packet, N being a code length.

The working process of the apparatus for supporting low bit rate LDPC code coding according to the present embodiment is illustrated below by means of two specific examples.

First Example

Given that a basic parity check matrix $Hb_{8 \times 16}$ is as follows:

|   | 0  | 1  | 2  | 3  | 4  | 5  | 6  | 7  | 8  | 9  | 10 | 11 | 12 | 13 | 14 | 15 |
|---|----|----|----|----|----|----|----|----|----|----|----|----|----|----|----|----|
|   |    |    |    |    | A  |    |    |    |    |    |    |    | B  |    |    |    |
| 0 | -1 | 0  | -1 | 0  | -1 | 0  | -1 | 0  | 0  | -1 | -1 | -1 | -1 | -1 | -1 | -1 |
| 1 | 0  | -1 | -1 | 34 | -1 | 12 | -1 | 36 | 18 | 23 | -1 | -1 | -1 | -1 | -1 | -1 |
| 2 | 8  | -1 | 0  | -1 | 0  | -1 | 0  | -1 | -1 | 36 | 0  | -1 | -1 | -1 | -1 | -1 |
| 3 | -1 | 16 | 40 | -1 | 32 | -1 | 22 | -1 | -1 | -1 | 19 | 0  | -1 | -1 | -1 | -1 |
| 4 | -1 | 20 | -1 | 22 | -1 | 2  | -1 | 28 | 32 | -1 | -1 | 21 | 0  | -1 | -1 | -1 |
| 5 | 30 | -1 | 18 | -1 | -1 | 14 | -1 | 30 | -1 | 18 | -1 | -1 | 31 | 0  | -1 | -1 |
| 6 | 40 | -1 | 12 | -1 | 38 | -1 | 6  | -1 | -1 | -1 | 26 | -1 | -1 | 13 | 0  | -1 |
| 7 | -1 | 24 | -1 | 20 | 10 | -1 | 2  | -1 | -1 | -1 | -1 | 18 | -1 | -1 | 5  | 0  |

A bit rate corresponding to the shown basic parity check matrix $Hb_{8 \times 16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. The coder 104 is a (16×42, 8×42) LDPC coder, a source data packet to be coded is a signalling sequence a=[$a_0, a_1, a_2, \ldots, a_{79}$] (k=80 bits), and when LDPC coding is carried out on the signalling sequence a using a 1/2 bit rate LDPC code basic parity check matrix to obtain a coded data packet e (n=672 bits), there are two processing modes.

In the first mode, when there is not a first-class filler 101,
the repeater 102 repeats the signalling sequence a for one time, and then expands to obtain a 168-bit data packet;

the second-class filler 103 fills the data packet repeated by the repeater 102 with 168 bit elements, and expands to obtain a second 336-bit data packet d=[$d_0, d_1, \ldots, d_{335}$], d being as follows:

$d_i = a_{i-172}$ $i=172,173,\ldots,209$ $d_i = a_{i-214}$ $i=214,215,\ldots,293$ $d_i = a_{i-256}$ $i=294,295,\ldots,335$;

$d_i = 0$ $i$=others the coder 104 carries out LDPC coding on the second data packet d to obtain a check data packet b=[$b_0, b_1, \ldots, b_{335}$];

the master code generator 105 combines the signalling sequence a and the 336-bit check data packet b into a 416-bit master code data packet s=[a, b]=[$s_0, s_1, \ldots, s_{415}$]; and the rate matcher 106 constructs a 672-bit coded data packet e by the master code data packet s, e being:

$e_j = s_j$ $j=0,1,\ldots,415$ $e_j = s_{j-416}$ $j=416,417,\ldots,671$.

In the second mode, when there is a first-class filler 101,
the first-class filler 101 fills the signalling sequence a with 4 bit elements into a first 84-bit data packet;

the repeater 102 splits the first data packet into two 42-bit sub-data packets, and then repeats each sub-data packet for one time respectively;

the second-class filler 103 fills the data packet repeated by the repeater 102 with 168 bit elements, and expands to obtain a second 336-bit data packet d=[$d_0, d_1, \ldots, d_{335}$], d being as follows:

$d_i = a_{i-172}$ $i=172,173,\ldots,209$ $d_i = a_{i-214}$ $i=214,215,\ldots,293$ $d_i = a_{i-256}$ $i=294,295,\ldots,335$;

$d_i = 0$ $i$=others the coder 104 carries out LDPC coding on the second data packet d to obtain a check data packet b=[$b_0, b_1, \ldots, b_{335}$];

the master code generator 105 combines the signalling sequence a and the 336-bit check data packet b into a 416-bit master code data packet s=[a, b]=[$s_0, s_1, \ldots, s_{415}$]; and the rate matcher 106 constructs a 672-bit coded data packet e by the master code data packet s, e being:

$e_j = s_j$ $j=0,1,\ldots,415$ $e_j = s_{j-416}$ $j=416,417,\ldots,671$.

Second Example

Given that a basic parity check matrix $Hb_{8 \times 16}$ is as follows:

|   | 0  | 1  | 2  | 3  | 4  | 5  | 6  | 7  | 8  | 9  | 10 | 11 | 12 | 13 | 14 | 15 |
|---|----|----|----|----|----|----|----|----|----|----|----|----|----|----|----|----|
|   |    |    |    |    | A  |    |    |    |    |    |    |    | B  |    |    |    |
| 0 | -1 | 39 | -1 | 13 | -1 | 22 | -1 | 9  | 20 | -1 | -1 | -1 | -1 | -1 | -1 | -1 |
| 1 | 17 | -1 | -1 | 26 | -1 | 2  | -1 | 18 | 40 | 4  | -1 | -1 | -1 | -1 | -1 | -1 |
| 2 | 34 | -1 | 24 | -1 | 28 | -1 | 19 | -1 | -1 | 8  | 29 | -1 | -1 | -1 | -1 | -1 |
| 3 | -1 | 36 | 6  | -1 | 14 | -1 | 38 | -1 | -1 | -1 | 16 | 30 | -1 | -1 | -1 | -1 |
| 4 | -1 | 33 | -1 | 39 | -1 | 24 | -1 | 27 | 18 | -1 | -1 | 18 | 33 | -1 | -1 | -1 |

-continued

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    | B  |    |    |    |    |
| 5 | 9  | −1 | 30 | −1 | −1 | 4  | −1 | 36 | −1 | 12 | −1 | −1 | 24 | 0  | −1 | −1 |
| 6 | 26 | −1 | 12 | −1 | 0  | −1 | 15 | −1 | −1 | −1 | 32 | −1 | −1 | −1 | 0  | −1 |
| 7 | −1 | 30 | −1 | 10 | 28 | −1 | 34 | −1 | −1 | −1 | −1 | 11 | −1 | −1 | −1 | 0  |

A bit rate corresponding to the shown basic parity check matrix $Hb_{8 \times 16}$ is 1/2, an expansion factor $z=42$, a matrix row number is 8, a matrix column number is 16, numbers shown in left is row indexes, uppermost numbers are column indexes, a letter 'A' represents a system bit part matrix, and a letter 'B' represents a check bit part matrix. The coder 104 is a (16×42, 8×42) LDPC coder, the basic parity check matrix is an 8×16 matrix, the expansion factor $z=42$, a source data packet to be coded is a signalling sequence $f=[f_0, f_1, \ldots, f_{39}]$ (k=40 bits), and when LDPC coding is carried out on the signalling sequence f using a 1/2 bit rate LDPC code basic parity check matrix to obtain a coded data packet h (n=672 bits), there are two processing modes.

In the first mode, when there is not a first-class filler 101, the repeater 102 repeats the signalling sequence f for one time, and then expands to obtain an 84-bit data packet;

the second-class filler 103 fills the data packet expanded by the repeater 102 with 252 bit elements, and expands to obtain a second 336-bit data packet $d=[d_0, d_1, \ldots, d_{335}]$, d being as follows:

$$d_i = f_{i-254} \; i=254, 255, \ldots, 293$$

$$d_i = f_{i-296} \; i=296, 297, \ldots, 335;$$

$$d_i = 0 \; i = \text{others}$$

the coder 104 carries out LDPC coding on the second data packet d to obtain a check data packet $b=[b_0, b_1, \ldots, b_{335}]$;

the master code generator 105 combines the signalling sequence a and the 336-bit check data packet b into a 376-bit master code data packet $g=[f,b]=[g_0, g_1, \ldots, g_{375}]$; and the rate matcher 106 constructs a 672-bit coded data packet h by the master code data packet g, h being:

$$h_j = g_j \; i=0,1,\ldots,375$$

$$h_j = g_{j-376} \; i=376, 417, \ldots, 671.$$

In the second mode, when there is a first-class filler 101, the first-class filler 101 fills the signalling sequence f with 2 bit elements into a first 42-bit data packet;

the repeater 102 repeats the first data packet for one time;

the second-class filler 103 fills the data packet repeated by the repeater 102 with 252 bit elements, and expands to obtain a second 336-bit data packet $d=[d_0, d_1, \ldots, d_{335}]$, d being as follows:

$$d_i = f_{i-254} \; i=254, 255, \ldots, 293$$

$$d_i = f_{i-296} \; i=296, 297, \ldots, 335;$$

$$d_i = 0 \; i = \text{others}$$

the coder 104 carries out LDPC coding on the second data packet d to obtain a check data packet $b=[b_0, b_1, \ldots, b_{335}]$;

the master code generator 105 combines the signalling sequence a and the 336-bit check data packet b into a 376-bit master code data packet $g=[f,b]=[g_0, g_1, \ldots, g_{375}]$; and the rate matcher 106 constructs a 672-bit coded data packet h by the master code data packet g, h being:

$$h_j = g_j \; i=0,1,\ldots,375$$

$$h_j = g_{j-376} \; i=376, 417, \ldots, 671.$$

Third Embodiment

Figure 3:
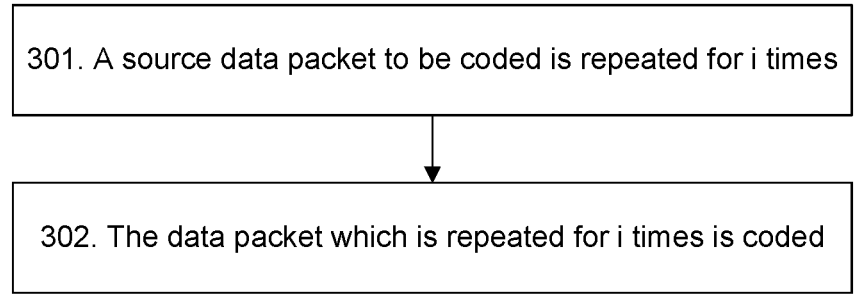
FIG. 3 is a flowchart of a method for supporting low bit rate coding provided by a third embodiment of the disclosure.

Based on the apparatus, the embodiment of the disclosure also implements a method for supporting low bit rate coding. As shown in FIG. 3, the method mainly includes the steps as follows.

Step 301: A source data packet to be coded is repeated for i times, i being a positive integer.

Repeating the source data packet to be coded for i times can be implemented in two modes, and in the first mode, the source data packet to be coded is directly repeated for i times; and in the second mode, the source data packet includes j sub-data packets, the j sub-data packets are repeated for i times respectively, j is a positive integer, and i may be 1, 2, 3, 4, 5 or 6 generally.

Step 302: The data packet repeated for i times is coded, coding being LDPC coding, Turbo coding or convolutional coding.

Here, coding may adopt (nb×z, kb×z) LDPC coding, and a master code data packet is obtained by coding, where nb is a column number of a basic parity check matrix, (nb−kb) is a row number of the basic parity check matrix, z is an expansion factor, and z, nb and kb are positive integers greater than 0. Before LDPC codes are coded, the basic parity check matrix is read, and then values of r non −1 element in the basic parity check matrix are set as −1, where r is an integer which is greater than or equal to 0 and is smaller than r0, and r0 is the number of non −1 elements in an original basic parity check matrix.

The check data packet will be obtained after Step 202, the method further includes that: rate matching is carried out on the master code data packet so as to obtain an N-bit coded data packet, N being a positive integer representative of a code length.

The steps of the method for supporting low bit rate LDPC code coding according to the present embodiment are illustrated below by means of four specific examples.

First Example

Given that a basic parity check matrix $Hb_{8\times16}$ is as follows:

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    |    | B  |    |    |    |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 0 | -1 | -1 | -1 | -1 | -1 | -1 |
| 2 | 8 | -1 | 0 | -1 | 0 | -1 | 0 | -1 | -1 | 13 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 |

A bit rate corresponding to the shown basic parity check matrix $Hb_{8\times16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. (16×42, 8×42) LDPC coding is adopted, a source data packet to be coded is a signalling sequence $a=[a_0, a_1, a_2, \ldots, a_{71}]$ (k=72 bits), and when LDPC coding is carried out on the signalling sequence a using a 1/2 bit rate LDPC code basic parity check matrix to obtain a coded data packet e (n=1024 bits), the signalling sequence a is repeated for one time, and a 336-bit data packet $d=[d_0, d_1, \ldots, d_{335}]$ is obtained by expansion, d being as follows:

$d_i = a_{i-180}\ i=180,181,\ldots,209$ $d_i = a_{i-222}\ i=222,223,\ldots,293$ $d_i = a_{i-264}\ i=294,295,\ldots,335;$ $d_i = 0\ i=\text{others}$ then, LDPC coding is carried out on the data packet d to obtain a check data packet $b=[b_0, b_1, \ldots, b_{335}]$, and the signalling sequence a and the 336-bit check data packet b are combined into a 408-bit master code data packet $s=[a,b]=[s_0, s_1, \ldots, s_{407}]$; and finally, a 1024-bit coded data packet e is constructed by the master code data packet s, e being:

$e_j = s_j\ j=0,1,\ldots,407$ $e_j = s_{j-408}\ j=408,409,\ldots,815$ $e_j = s_{j-816}\ j=816,817,\ldots,1023.$ Second Example Given that a basic parity check matrix $Hb_{8\times16}$ is as follows:

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    |    | B  |    |    |    |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 0 | -1 | -1 | -1 | -1 | -1 | -1 |
| 2 | 8 | -1 | 0 | -1 | 0 | -1 | 0 | -1 | -1 | 13 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 |

A bit rate corresponding to the shown basic parity check matrix $Hb_{8\times16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. (16×42, 8×42) LDPC coding is adopted, a source data packet to be coded is a signalling sequence $a=[a_0, a_1, a_2, \ldots, a_{79}]$ (k=80 bits), and when LDPC coding is carried out on the signalling sequence a using a 1/2 bit rate LDPC code basic parity check matrix to obtain a coded data packet e (n=672 bits), the signalling sequence a is repeated for one time, and a 336-bit data packet $d=[d_0, d_1, \ldots, d_{335}]$ is obtained by expansion, d being as follows:

$d_i = a_{i-172}\ i=172,173,\ldots,209$ $d_i = a_{i-214}\ i=214,215,\ldots,293$ $d_i = a_{i-256}\ i=294,295,\ldots,335;$ $d_i = 0\ i=\text{others}$ then, LDPC coding is carried out on the data packet d to obtain a check data packet $b=[b_0, b_1, \ldots, b_{335}]$, and the signalling sequence a and the 336-bit check data packet b are combined into a 416-bit master code data packet $s=[a,b]=[s_0, s_1, \ldots, s_{415}]$; and finally, a 672-bit coded data packet e is constructed by the master code data packet s, e being:

$e_j = s_j\ j=0,1,\ldots,415$ $e_j = s_{j-416}\ j=416,417,\ldots,671.$

Third Example

Given that a basic parity check matrix $Hb_{8\times 16}$ is as follows:

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    | B  |    |    |    |    |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 23 | -1 | -1 | -1 | -1 | -1 | -1 |
| 2 | 8 | -1 | 0 | -1 | 0 | -1 | 0 | -1 | -1 | 36 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 18 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 |

A bit rate corresponding to the shown basic parity check matrix $Hb_{8\times 16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. (16×42, 8×42) LDPC coding is adopted, the basic parity check matrix is an 8×16 matrix, the expansion factor z=42, a source data packet to be coded is a signalling sequence $f=[f_0, f_1, \ldots, f_{39}]$ (k=40 bits), and when LDPC coding is carried out on the signalling sequence f using a 1/2 bit rate LDPC code basic parity check matrix to obtain a coded data packet h (n=672 bits), the signalling sequence f is repeated for one time, and a 336-bit data packet $d=[d_0, d_1, \ldots, d_{335}]$ is obtained by expansion, d being as follows:

$d_i = f_{i-254}$ $i=254,255,\ldots,293$ $d_i = f_{i-296}$ $i=296,297,\ldots,335;$ $d_i = 0$ $i=$others then, LDPC coding is carried out on the data packet d to obtain a check data packet $b=[b_0, b_1, \ldots, b_{335}]$, and the signalling sequence a and the 336-bit check data packet b are combined into a 376-bit master code data packet $g=[f,b]=[g_0, g_1, \ldots, g_{375}]$; and finally, a 672-bit coded data packet h is constructed by the master code data packet g, h being:

$h_j = g_j$ $i=0,1,\ldots,375$ $h_j = g_{j-376}$ $i=376,417,\ldots,671.$

Fourth Example

Given that a basic parity check matrix $Hb_{8\times 16}$ is as follows:

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    | B  |    |    |    |    |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 0 | -1 | -1 | -1 | -1 | -1 | -1 |
| 2 | 8 | -1 | 0 | -1 | 0 | -1 | 0 | -1 | -1 | 13 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 |

A bit rate corresponding to the shown basic parity check matrix $Hb_{8\times 16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. (16×42, 8×42) LDPC coding is adopted, a source data packet to be coded is a signalling sequence $a=[a_0, a_1, a_2, \ldots, a_{79}]$ (k=80 bits), and when LDPC coding is carried out on the signalling sequence a using a 1/2 bit rate LDPC code basic parity check matrix to obtain a coded data packet e (n=672 bits), the signalling sequence a is repeated for one time, and a 336-bit data packet $d=[d_0, d_1, \ldots, d_{335}]$ is obtained by expansion, d being as follows:

$d_i = a_{i-172}$ $i=172,173,\ldots,209$ $d_i = a_{i-214}$ $i=214,215,\ldots,293$ $d_i = a_{i-256}$ $i=294,295,\ldots,335;$ $d_i = 0$ $i=$others then, an element '0' in the second row and the sixth column in the basic parity check matrix is modified into '−1' first, and the modified basic parity check matrix is as follows:

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    | B  |    |    |    |    |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 0 | -1 | -1 | -1 | -1 | -1 | -1 |
| 2 | 8 | -1 | 0 | -1 | 0 | -1 | -1 | -1 | -1 | 13 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 |

LDPC coding is carried out on the data packet d to obtain a check data packet $b=[b_0, b_1, \ldots, b_{335}]$, and the signalling sequence a and the 336-bit check data packet b are combined into a 416-bit master code data packet $s=[a,b]=[s_0, s_1, \ldots, s_{415}]$; and finally, a 672-bit coded data packet e is constructed by the master code data packet s, e being:

$$e_j = s_j, j=0,1,\ldots,415$$

$$e_j = s_{j-416}, j=416,417,\ldots,671.$$

Fourth Embodiment

The embodiment of the disclosure implements a method for supporting low bit rate coding. The basic steps are the same as those of the third embodiment. In the present embodiment, before Step 301, a first data packet can be obtained by filling a source data packet to be coded with q1 elements and then expanding, q1 being a positive integer.

Here, repeating the source data packet to be coded for i times can be implemented in two modes, and in the first mode, the first data packet is directly repeated for i times; and in the second mode, the first data packet is split into j sub-data packets, each sub-data packet is repeated for i times respectively, j is a positive integer, and i may be 1, 2, 3, 4, 5 or 6 generally.

The method according to the present embodiment further includes that: the data packet repeated for i times is filled with q2 elements so as to obtain a second data packet by expansion.

According to the present embodiment, in Step 302, (nb×z, kb×z) LDPC coding is adopted, and a check data packet is obtained by coding, where nb is a column number of a basic parity check matrix, (nb−kb) is a row number of the basic parity check matrix, z is an expansion factor, and z, nb and kb are positive integers greater than 0. Before LDPC codes are coded, the basic parity check matrix is read, and then values of r non −1 element in the basic parity check matrix are set as −1, where r is an integer which is greater than or equal to 0 and is smaller than r0, and r0 is the number of non −1 elements in an original basic parity check matrix.

The method according to the present embodiment further includes that: the check data packet and the source data packet are combined into a master code data packet, and after the master code data packet is obtained, an N-bit coded data packet can be obtained by carrying out rate matching on the master code data packet.

The steps of the method for supporting low bit rate LDPC code coding according to the present embodiment are illustrated below by means of two specific examples.

First Example

Given that a basic parity check matrix $Hb_{8 \times 16}$ is as follows:

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   | A |   |   |   |   |   |   |    | B  |    |    |    |    |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 0 | -1 | -1 | -1 | -1 | -1 | -1 |
| 2 | 8 | -1 | 0 | -1 | 0 | -1 | 0 | -1 | -1 | 13 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 |

A bit rate corresponding to the shown basic parity check matrix $Hb_{8 \times 16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. (16×42, 8×42) LDPC coding is adopted, a source data packet to be coded is a signalling sequence $a=[a_0, a_1, a_2, \ldots, a_{79}]$ (k=80 bits), and when LDPC coding is carried out on the signalling sequence a using a 1/2 bit rate LDPC code basic parity check matrix to obtain a coded data packet e (n=672 bits), there are two processing modes.

In the first mode, firstly, the signalling sequence a is repeated for one time, and a 168-bit data packet is obtained by expansion;

then, the data packet is filled with 168 bit elements, and a second 336-bit data packet $d=[d_0, d_1, \ldots, d_{335}]$ is obtained by expansion, d being as follows:

$$d_i = a_{i-172}, i=172,173,\ldots,209$$

$$d_i = a_{i-214}, i=214,215,\ldots,293$$

$$d_i = a_{i-256}, i=294,295,\ldots,335;$$

$$d_i = 0, i = \text{others}$$

then, LDPC coding is carried out on the second data packet d to obtain a check data packet b=[$b_0, b_1, \ldots, b_{335}$], and the signalling sequence a and the 336-bit check data packet b are combined into a 416-bit master code data packet s=[a,b]=[$s_0, s_1, \ldots, s_{415}$]; and finally, a 672-bit coded data packet e is constructed by the master code data packet s, e being:

$$e_j = s_j, j=0,1,\ldots,415$$

$$e_j = s_{j-416}, j=416,417,\ldots,671.$$

In the second mode, firstly, the signalling sequence a is filled with 4 bit elements to expand into a first 84-bit data packet, the first data packet is split into two 42-bit sub-data packets, and then each sub-data packet is repeated for one time respectively;

then, the repeated data packet is filled with 168 bit elements, and a second 336-bit data packet d=[$d_0, d_1, \ldots, d_{335}$] is obtained by expansion, d being as follows:

$$d_i = a_{i-172}, i=172,173,\ldots,209$$

$$d_i = a_{i-214}, i=214,215,\ldots,293$$

$$d_i = a_{i-256}, i=294,295,\ldots,335;$$

$$d_i = 0, i=\text{others}$$

then, LDPC coding is carried out on the second data packet d to obtain a check data packet b=[$b_0, b_1, \ldots, b_{335}$], and the signalling sequence a and the 336-bit check data packet b are combined into a 416-bit master code data packet s=[a,b]=[$s_0, s_1, \ldots, s_{415}$]; and finally, a 672-bit coded data packet e is constructed by the master code data packet s, e being:

$$e_j = s_j, j=0,1,\ldots,415$$

$$e_j = s_{j-416}, j=416,417,\ldots,671.$$

Second Example

Given that a basic parity check matrix $Hb_{8\times16}$ is as follows:

In the first mode, firstly, the signalling sequence f is repeated for one time, and an 84-bit data packet is obtained by expansion; the data packet is filled with 252 bit elements, and a second 336-bit data packet d=[$d_0, d_1, \ldots, d_{335}$] is obtained, d being as follows:

$$d_i = f_{i-254}, i=254,255,\ldots,293$$

$$d_i = f_{i-296}, i=296,297,\ldots,335;$$

$$d_i = 0, i=\text{others}$$

then, LDPC coding is carried out on the second data packet d to obtain a check data packet b=[$b_0, b_1, \ldots, b_{335}$], the signalling sequence a and the 336-bit check data packet b are combined into a 376-bit master code data packet g=[f,b]=[$g_0, g_1, \ldots, g_{375}$]; and finally, a 672-bit coded data packet h is constructed by the master code data packet g, h being:

$$h_j = g_j, i=0,1,\ldots,375$$

$$h_j = g_{j-376}, i=376,417,\ldots,671.$$

In the second mode, firstly, the signalling sequence f is filled with 2 bit elements to expand into a first 42-bit data packet, and the first data packet is repeated for one time;

then, the repeated data packet is filled with 252 bit elements, and a second 336-bit data packet d=[$d_0, d_1, \ldots, d_{335}$] is obtained by expansion, d being as follows:

$$d_i = f_{i-254}, i=254,255,\ldots,293$$

$$d_i = f_{i-296}, i=296,297,\ldots,335;$$

$$d_i = 0, i=\text{others}$$

then, LDPC coding is carried out on the second data packet d to obtain a check data packet b=[$b_0, b_1, \ldots, b_{335}$], and the signalling sequence a and the 336-bit check data packet b are combined into a 376-bit master code data packet g=[f,b]=[$g_0, g_1, \ldots, g_{375}$]; and

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
|   |   |   |   |   | A |   |   |   |   |   |    |    | B  |    |    |    |
| 0 | −1 | 0 | −1 | 0 | −1 | 0 | −1 | 0 | 0 | −1 | −1 | −1 | −1 | −1 | −1 | −1 |
| 1 | 0 | −1 | −1 | 34 | −1 | 12 | −1 | 36 | 18 | 23 | −1 | −1 | −1 | −1 | −1 | −1 |
| 2 | 8 | −1 | 0 | −1 | 0 | −1 | 0 | −1 | −1 | 36 | 0 | −1 | −1 | −1 | −1 | −1 |
| 3 | −1 | 16 | 40 | −1 | 32 | −1 | 22 | −1 | −1 | −1 | 19 | 0 | −1 | −1 | −1 | −1 |
| 4 | −1 | 20 | −1 | 22 | −1 | 2 | −1 | 28 | 32 | −1 | −1 | 21 | 0 | −1 | −1 | −1 |
| 5 | 30 | −1 | 18 | −1 | −1 | 14 | −1 | 30 | −1 | 18 | −1 | −1 | 31 | 0 | −1 | −1 |
| 6 | 40 | −1 | 12 | −1 | 38 | −1 | 6 | −1 | −1 | −1 | 26 | −1 | −1 | 13 | 0 | −1 |
| 7 | −1 | 24 | −1 | 20 | 10 | −1 | 2 | −1 | −1 | −1 | −1 | 18 | −1 | −1 | 5 | 0 |

A bit rate corresponding to the shown basic parity check matrix $Hb_{8\times16}$ is 1/2, an expansion factor z=42, a matrix row number is 8, a matrix column number is 16, numbers shown in left is row indexes, uppermost numbers are column indexes, a letter 'A' represents a system bit part matrix, and a letter 'B' represents a check bit part matrix. (16×42, 8×42) LDPC coding is adopted, the basic parity check matrix is an 8×16 matrix, the expansion factor z=42, a source data packet to be coded is a signalling sequence f=[$f_0, f_1, \ldots, f_{39}$] (k=40 bits), and when LDPC coding is carried out on the signalling sequence f using a 1/2 bit rate LDPC code basic parity check matrix to obtain a coded data packet h (n=672 bits), there are two processing modes.

finally, a 672-bit coded data packet h is constructed by the master code data packet g, h being:

$$h_j = g_j, i=0,1,\ldots,375$$

$$h_j = g_{j-376}, i=376,417,\ldots,671.$$

If the method for supporting low bit rate coding in the embodiment of the disclosure is implemented in a form of a software function module and when being sold or used as an independent product, the product may also be stored in a computer readable storage medium. Based on this understanding, those skilled in the art shall understand that the embodiments of the disclosure may be provided as a method, a system or a computer program product. Thus, forms of complete hardware embodiments, complete software embodiments or embodiments integrating software and hardware may be adopted in the disclosure. Moreover, a form of the computer program product implemented on one or more computer available storage media containing computer available program codes may be adopted in the disclosure. The storage media include, but are not limited to, a U disk, a mobile hard disk, a Read-Only Memory (ROM), a magnetic disk memory, a CD-ROM, an optical memory and the like.

The disclosure is described with reference to flowcharts and/or block diagrams of the method, the device (system) and the computer program product according to the embodiments of the disclosure. It will be appreciated that each flow and/or block in the flowcharts and/or the block diagrams and combination of the flows and/or the blocks in the flowcharts and/or the block diagrams may be implemented by computer program instructions. These computer program instructions may be provided to a general computer, a dedicated computer, an embedded processor or processors of other programmable data processing devices to generate a machine, such that an apparatus for implementing functions designated in one or more flows of the flowcharts and/or one or more blocks of the block diagrams is generated via instructions executed by the computers or the processors of the other programmable data processing devices.

These computer program instructions may also be stored in a computer readable memory capable of guiding the computers or the other programmable data processing devices to work in a specific mode, such that a manufactured product including an instruction apparatus is generated via the instructions stored in the computer readable memory, and the instruction apparatus implements the functions designated in one or more flows of the flowcharts and/or one or more blocks of the block diagrams.

These computer program instructions may also be loaded to the computers or the other programmable data processing devices, such that processing implemented by the computers is generated by executing a series of operation steps on the computers or the other programmable devices, and therefore the instructions executed on the computers or the other programmable devices provide a step of implementing the functions designated in one or more flows of the flowcharts and/or one or more blocks of the block diagrams.

Accordingly, an embodiment of the disclosure also provides a computer storage medium. A computer program is stored therein and is configured to execute the method for supporting low bit rate coding according to the embodiment of the disclosure.

The above is only the preferred embodiments of the disclosure and is not used to limit the protective scope of the disclosure.

INDUSTRIAL APPLICABILITY

All the embodiments of the disclosure are integrated. By repeating a source data packet to be coded for several times and then coding the data packet, coding gains can be fully utilized, and the coding and decoding performances of a coding and decoding system under a lower bit rate are improved.

What is claimed is:

1. An apparatus for supporting low bit rate coding, comprising: a repeater and an encoder, wherein
   the repeater is configured to repeat a source data packet for i times,
      wherein repeating the source data packet for i times comprises: splitting the source data packet into j sub-data packets with a same length, and repeating each of the j sub-data packets for i times respectively to obtain a repeated data packet, i and j being positive integers; and
   the encoder is configured to encode the repeated data packet, the encoding being Low Density Parity Check (LDPC) coding,
      wherein encoding the repeated data packet comprises: encoding the repeated data packet based on a basic parity check matrix and an expansion factor to obtain a master code data packet.

2. The apparatus according to claim 1, wherein the encoder is further configured to read, before the encoding, the basic parity check matrix; and
   the encoder is further configured to set, after reading the basic parity check matrix, values of r non −1 elements in the basic parity check matrix as −1, where r is an integer which is greater than or equal to 0 and is smaller than r0, r0 is a number of original non −1 elements in the basic parity check matrix, the −1 element represents a z×z zero matrix, and the non −1 element represents a z×z shifted unit matrix.

3. The apparatus according to claim 1, wherein the length of each of the j sub-data packets is equal to the expansion factor.

4. A method for supporting low bit rate coding, comprising:
   repeating a source data packet for i times,
      wherein repeating the source data packet for i times comprises: splitting the source data packet into j sub-data packets with a same length, and repeating each of the j sub-data packets for i times respectively to obtain a repeated data packet, i and j being positive integers; and
   encoding the repeated data packet, wherein the encoding is Low Density Parity Check (LDPC) coding,
      wherein encoding the repeated data packet comprises: encoding the repeated data packet based on a basic parity check matrix and an expansion factor to obtain a master code data packet.

5. The method according to claim 4, further comprising: carrying out rate matching on the master code data packet so as to obtain an N-bit coded data packet, N being a code length.

6. The method according to claim 4, wherein the basic parity check matrix is as follows:

|   | 0  | 1  | 2  | 3  | 4  | 5  | 6  | 7  | 8  | 9  | 10 | 11 | 12 | 13 | 14 | 15 |
|---|----|----|----|----|----|----|----|----|----|----|----|----|----|----|----|----|
|   |    |    |    | A  |    |    |    |    |    |    |    |    | B  |    |    |    |
| 0 | −1 | 0  | −1 | 0  | −1 | 0  | −1 | 0  | 0  | −1 | −1 | −1 | −1 | −1 | −1 | −1 |
| 1 | 0  | −1 | −1 | 34 | −1 | 12 | −1 | 36 | 18 | 0  | −1 | −1 | −1 | −1 | −1 | −1 |
| 2 | 8  | −1 | 0  | −1 | 0  | −1 | 0  | −1 | −1 | 13 | 0  | −1 | −1 | −1 | −1 | −1 |
| 3 | −1 | 16 | 40 | −1 | 32 | −1 | 22 | −1 | −1 | −1 | 19 | 0  | −1 | −1 | −1 | −1 |
| 4 | −1 | 20 | −1 | 22 | −1 | 2  | −1 | 28 | 32 | −1 | −1 | 21 | 0  | −1 | −1 | −1 |

-continued

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| | | | | | A | | | | | | | | B | | | |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 | wherein the leftmost column represents row indexes, the uppermost row represents column indexes, a letter 'A' represents a system bit part matrix, and a letter 'B' represents a check bit part matrix.

7. The method according to claim 4, further comprising: filling, before repeating the source data packet for i times, the source data packet with q1 elements to expand the source data packet into a first data packet, q1 being a positive integer.

8. The method according to claim 7, further comprising: filling, after repeating the source data packet for i times and before encoding the repeated data packet, the repeated data packet with q2 elements to obtain a second data packet, q2 being a positive integer.

9. The method according to claim 8, further comprising: encoding the second data packets to obtain a check data packet.

10. The method according to claim 9, wherein the basic parity check matrix is as follows:

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| | | | | | A | | | | | | | | B | | | |
| 0 | -1 | 0 | -1 | 0 | -1 | 0 | -1 | 0 | 0 | -1 | -1 | -1 | -1 | -1 | -1 | -1 |
| 1 | 0 | -1 | -1 | 34 | -1 | 12 | -1 | 36 | 18 | 0 | -1 | -1 | -1 | -1 | -1 | -1 |
| 2 | 8 | -1 | 0 | -1 | 0 | -1 | 0 | -1 | -1 | 13 | 0 | -1 | -1 | -1 | -1 | -1 |
| 3 | -1 | 16 | 40 | -1 | 32 | -1 | 22 | -1 | -1 | -1 | 19 | 0 | -1 | -1 | -1 | -1 |
| 4 | -1 | 20 | -1 | 22 | -1 | 2 | -1 | 28 | 32 | -1 | -1 | 21 | 0 | -1 | -1 | -1 |
| 5 | 30 | -1 | 18 | -1 | -1 | 14 | -1 | 30 | -1 | 37 | -1 | -1 | 31 | 0 | -1 | -1 |
| 6 | 40 | -1 | 12 | -1 | 38 | -1 | 6 | -1 | -1 | -1 | 26 | -1 | -1 | 13 | 0 | -1 |
| 7 | -1 | 24 | -1 | 20 | 10 | -1 | 2 | -1 | -1 | -1 | -1 | 18 | -1 | -1 | 5 | 0 | wherein the leftmost column represents row indexes, the uppermost row represents column indexes, a letter 'A' represents a system bit part matrix, and a letter 'B' represents a check bit part matrix.

11. The method according to claim 10, further comprising: combining the check data packet and the source data packet into the master code data packet.

12. The method according to claim 11, further comprising: carrying out rate matching on the master code data packet so as to obtain an N-bit coded data packet, N being a code length.

13. The method according to claim 12, wherein the encoding is (16×42, 8×42) LDPC coding, the basic parity check matrix is an 8×16 matrix, the expansion factor z=42, the source data packet is a signalling sequence $a=[a_0, a_1, a_2, \ldots, a_{79}]$ (k=80 bits), and when LDPC coding is carried out on the signalling sequence a using a 1/2 bit rate LDPC code basic parity check matrix to obtain a coded data packet e (n=672 bits), $$d_i = a_{i-172} \; i=172, 173, \ldots, 209$$

$$d_i = a_{i-214} \; i=214, 215, \ldots, 293$$

$$d_i = a_{i-256} \; i=294, 295, \ldots, 335;$$

$$d_i = 0 \; i=\text{others}$$

$$e_j = s_j \; j=0, 1, \ldots, 415$$

$$e_j = s_{j-416} \; j=416, 417, \ldots, 671;$$

firstly, the signalling sequence a is filled with 4 bit elements to expand into a first data packet with a length of 84-bit, the first data packet is split into two 42-bit sub-data packets, and then each 42-bit sub-data packet is repeated for one time respectively;

then, the repeated data packet is filled with 168 bit elements and expanded to obtain a second data packet with a length of 336-bit, $d=[d_0, d_1, \ldots, d_{335}]$, d being as follows:

$$d_i = a_{i-172} \; i=172, 173, \ldots, 209$$

$$d_i = a_{i-214} \; i=214, 215, \ldots, 293$$

$$d_i = a_{i-256} \; i=294, 295, \ldots, 335;$$

$$d_i = 0 \; i=\text{others}$$

then, LDPC coding is carried out on the second data packet d to obtain a check data packet with a length of 336-bit, $b=[b_0, b_1, \ldots, b_{335}]$, and the signalling sequence a and the check data packet b are combined into a master code data packet with a length of 416-bit, $$s=[a, b]=[s_0, s_1, \ldots, s_{415}]; \text{ and}$$

finally, a 672-bit coded data packet e is constructed by the master code data packet s, e being:

$$e_j = s_j \; j=0, 1, \ldots, 415$$

$$e_j = s_{j-416} \; j=416, 417, \ldots, 671.$$

14. The method according to claim 4, wherein the method further comprises: reading, before the coding, the basic parity check matrix; and the coding comprises: setting values of r non −1 elements in the basic parity check matrix as −1, where r is an integer which is greater than or equal to 0 and is smaller than r0, r0 is a number of original non −1 elements in the basic parity check matrix, the −1 element represents a z×z zero matrix, and the non −1 element represents a z×z shifted unit matrix.

15. The method according to claim 4, wherein the length of each of the j sub-data packets is equal to the expansion factor.

16. A computer storage medium, wherein a computer program is stored therein and is configured to execute a method for supporting low bit rate coding, the method comprises the following steps of:

repeating a source data packet for i times,
        wherein repeating the source data packet for i times comprises: splitting the source data packet into j sub-data packets with a same length, and repeating each of the j sub-data packets for i times respectively to obtain a repeated data packet, i and j being positive integers; and
    encoding the repeated data packet, wherein the encoding is Low Density Parity Check (LDPC) coding,
    wherein encoding the repeated data packet comprises: encoding the repeated data packet based on a basic parity check matrix and an expansion factor to obtain a master code data packet.

\* \* \* \* \*